(12) United States Patent
Bianucci et al.

(10) Patent No.: US 8,643,823 B2
(45) Date of Patent: Feb. 4, 2014

(54) STRESS-DECOUPLING DEVICES AND METHODS FOR COOLED MIRROR SYSTEMS

(75) Inventors: Giovanni Bianucci, Vimercate (IT); Stefano Moretti, Camparada (IT); Gordon Yue, Sunnyvale, CA (US); Gian Luca Cassol, Sirtori (IT)

(73) Assignee: Media Lario S.R.L., Bosisio Parini (LC) (IT)

( * ) Notice: Subject to any disclaimer, the term of this patent is extended or adjusted under 35 U.S.C. 154(b) by 994 days.

(21) Appl. No.: 12/660,222

(22) Filed: Feb. 23, 2010

(65) Prior Publication Data

US 2011/0205506 A1   Aug. 25, 2011

(51) Int. Cl.
*G03B 27/42* (2006.01)
(52) U.S. Cl.
USPC .......................................................... 355/53
(58) Field of Classification Search
USPC ............. 355/30, 53, 55, 63, 67, 77; 361/689; 250/504
See application file for complete search history.

(56) References Cited

U.S. PATENT DOCUMENTS

| | | | | |
|---|---|---|---|---|
| 2006/0093253 A1* | 5/2006 | Egle et al. | ........................... | 385/7 |
| 2007/0084461 A1* | 4/2007 | Box et al. | ........................ | 126/625 |
| 2007/0193547 A1* | 8/2007 | Iwata et al. | .............. | 123/188.13 |

* cited by examiner

*Primary Examiner* — Steven H Whitesell Gordon
*Assistant Examiner* — Mesfin T Asfaw
(74) *Attorney, Agent, or Firm* — Opticus IP Law PLLC (57) ABSTRACT

A stress-decoupling device and methods of using same in a cooled grazing-incidence collector (GIC) mirror system are disclosed. A method includes providing a cooled GIC shell, providing input and output primary cooling-fluid manifolds, and fluidly connecting the cooled GIC shell to the input and output primary cooling-fluid manifolds through respective stress-decoupling devices. An exemplary stress-decoupling device includes inner and outer bellows that define a sealed cavity filled with a gas. An expansion-limiting member within the sealed cavity limits the expansion of the inner bellows due to the pressure of the cooling fluid flowing therethrough. The stress-decoupling device reduces or prevents the communication of stress from parts of the GIC mirror system to the GIC shells. Stress-decoupling systems and methods for a cooled spider as used in a GIC mirror system are also disclosed.

23 Claims, 9 Drawing Sheets

STRESS-DECOUPLING DEVICES AND METHODS FOR COOLED MIRROR SYSTEMS

CROSS-REFERENCE TO RELATED APPLICATIONS

The present application is related to U.S. patent application Ser. No. 12/592,735, entitled "Cooling systems and methods for grazing incidence EUV lithography collectors," filed on Dec. 2, 2009, which application is assigned to the Assignee of the present application and which application is incorporated by reference herein.

The present invention is also related to U.S. patent application Ser. No. 12/657,650, filed on Jan. 25, 2010, and entitled "Cooled spider and method for grazing-incidence collectors," which application is assigned to the Assignee of the present application and which application is incorporated by reference herein.

FIELD OF THE INVENTION

The present invention relates generally to mirror systems, and in particular to stress-decoupling devices and methods for use in cooled mirror systems.

BACKGROUND ART

EUV lithography is anticipated to be the lithographic process of choice for producing future generations of semiconductor devices having linewidths on the order of 32 nm and smaller. The wavelength of the EUV radiation is nominally 13.5 nm, which calls for the use of specialized optics to collect and image the EUV radiation.

One type of EUV optical system used to collect the radiation from the light source is a grazing incidence collector (GIC). Another type is a constant-incidence collector (CIC). A GIC typically comprises one or more concentrically arranged shells configured to receive light from the EUV source at grazing incidence and reflect the light to form a focused illumination beam that first forms an intermediate focus and then creates an illumination region in the far field. The far-field illumination region is preferably uniform to within a specification set by the overall system optical design.

The light sources being considered for EUV lithography include a discharge-produced plasma (DPP) and laser-produced plasma (LPP). The conversion efficiency of these sources is only a few percent, with most of the energy used to generate the EUV radiation converted to infrared, visible and UV radiation and energetic particles that can be incident upon the collector mirror. This radiation causes a substantial thermal load on the GIC mirror. Each GIC mirror shell therefore needs to be cooled so that the heat absorbed by the mirror does not substantially adversely affect GIC mirror performance or damage the GIC mirror.

The same radiation can also heat the spider that holds the GIC shells in a fixed relation to one another. Accordingly, the spider is also preferably cooled so that heat absorbed by the spider is not transferred to the GIC shells, and so that the spider itself does not change its shape. Thus, the GIC mirror is actually part of a GIC mirror system that also includes a GIC shell cooling system and that may also include a spider cooling system.

Essentially all GIC mirror systems for EUV lithography have been used to date only in the laboratory or for experimental "alpha" systems under very controlled conditions. As such, there has been little effort directed to GIC shell cooling systems and spider cooling systems for use in a commercially viable EUV lithography system. In fact, the increasing demand for higher EUV power promises an increased thermal load on the GIC mirror, making such thermal management even more important.

Consequently, more efficient and effective thermal management and cooling systems must be implemented to minimize the potential for optical distortion of the GIC mirror due to the thermal load. The need for thermal management requires a GIC mirror system that is relatively complicated to fabricate. In particular, the GIC mirror needs to be interfaced with the GIC shell cooling system and the optional spider cooling system without causing mechanical distortion of the GIC shells of the GIC mirror.

SUMMARY OF THE INVENTION

Aspects of the invention include stress-decoupling devices for and methods of using such devices in a cooled mirror system such as a cooled GIC mirror system that includes cooled GIC shells supported by a spider, which may also be cooled.

An example method of the invention includes providing a cooled GIC shell, providing input and output primary cooling-fluid manifolds, and fluidly connecting the cooled GIC shell to the input and output primary cooling-fluid manifolds through respective stress-decoupling devices. An example stress-decoupling device includes inner and outer bellows that define a sealed cavity filled with a gas. An expansion-limiting member limits the expansion of the inner bellows due to the pressure of the cooling fluid flowing therethrough. The stress-decoupling device is configured and disposed to reduce or prevent the communication of stress from parts of the GIC mirror system to the GIC shells and can be arranged anywhere in the GIC mirror system to accomplish this function. More than one stress-decoupling device may be included in a given fluid-conducting member. Exemplary locations include within or at one or both ends of fluid-conducting members (e.g., "feeder lines") that connect cooling lines or cooling channels to a cooling fluid manifold.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

The various elements depicted in the drawing are merely representational and are not necessarily drawn to scale. Certain sections thereof may be exaggerated, while others may be minimized. The drawings are intended to illustrate example embodiments of the invention that can be understood and appropriately carried out by those of ordinary skill in the art.

DETAILED DESCRIPTION OF THE INVENTION

The invention is described below in connection with a GIC mirror and GIC cooling system by way of illustration. The invention applies to other types of cooled mirrors, such as the aforementioned CIC mirror, that include a mirror element, such as a GIC shell, and a cooling system that needs to be mechanically connected thereto.

Figure 1:
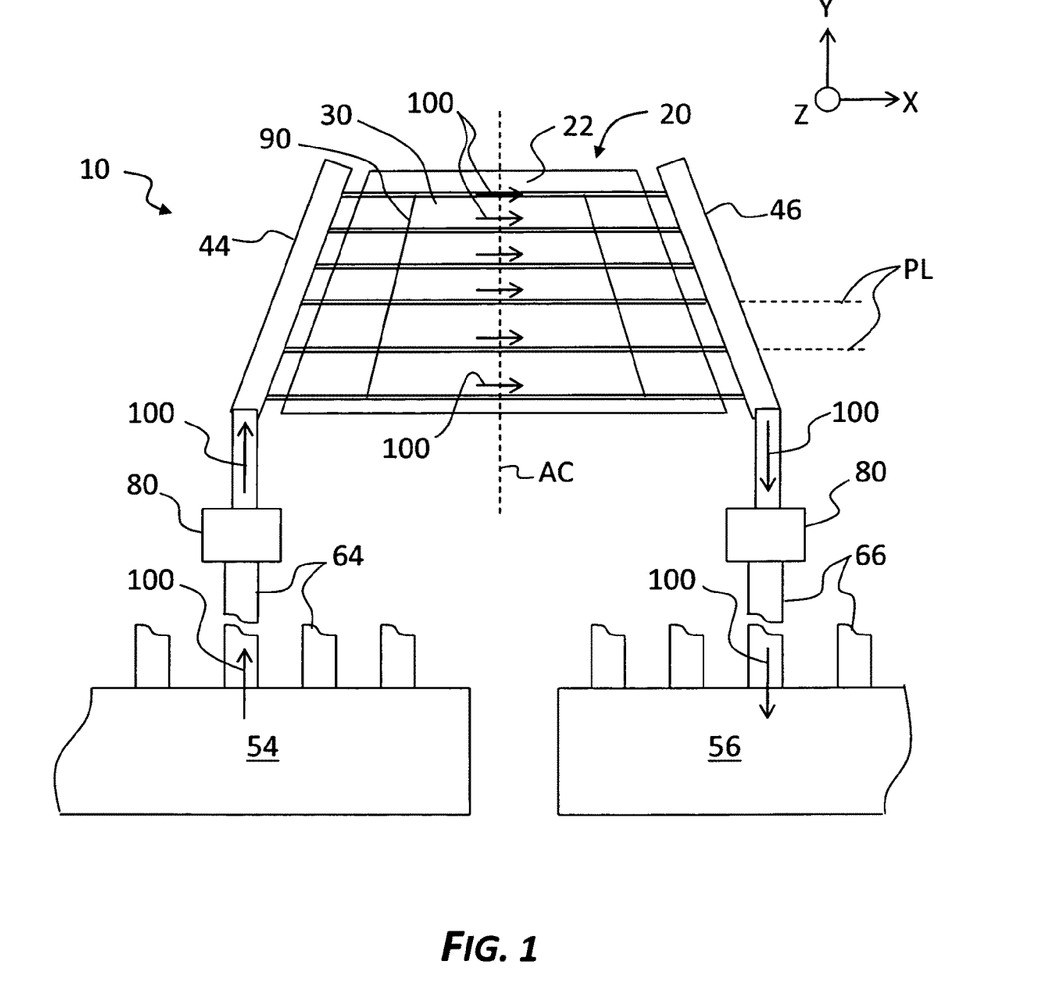
FIG. 1 is a schematic diagram of an example embodiment of a GIC shell cooling system for cooling a GIC shell.

FIG. 1 is a schematic diagram of an example embodiment of a mirror system in the form of a GIC shell cooling system 10 for cooling a mirror in the form of a GIC shell 20. Multiple GIC shell cooling systems 10 along with their corresponding GIC shell 20 can be combined to form a cooled GIC mirror and a GIC mirror system, as described in greater detail below.

GIC shell 20 has a back surface 22 and a central axis AC. A Cartesian coordinate system is shown in FIG. 1 and subsequent Figures for the sake of reference. GIC shell 20 is typically axially symmetric so that back surface 22 typically has an associated radius that varies with position along central axis AC.

GIC shell cooling system 10 also includes a plurality of spaced apart cooling lines 30 that are disposed relative to GIC shell back surface 22 so as to be in thermal communication therewith. In an example embodiment, cooling lines 30 include nickel (e.g., nickel tubing) and can have a round or non-round (e.g., oblate or oval) cross-sectional shape. An example cooling line outside diameter is in the range from about 5 mm to about 6 mm. In example embodiments, at least some of cooling lines 30 have a different diameter.

Cooling lines 30 are arranged in substantially parallel planes PL that are substantially perpendicular to central axis AC of GIC shell 20 so that each cooling line 30 traverses the circumference of the GIC shell 20 at a given radius. Input and output cooling-fluid manifolds 44 and 46 are arranged adjacent back surface 22 of GIC shell 20. Input and output cooling-fluid manifolds 44 and 46 are configured to connect to multiple cooling lines 30 for the given GIC shell 20 so that cooling fluid 100 can flow from the input cooling-fluid manifold 44, then to all of the cooling lines 30, and then to the output cooling-fluid manifold 46.

Input and output cooling-fluid manifolds 44 and 46 can be thought of as "secondary" manifolds (hereinafter "secondary manifolds") that are respectively connected to input and output "primary" manifolds 54 and 56 via respective input and output feeder lines 64 and 66. An example outside diameter of the input and output feeder lines 64 and 66 is 11 mm. Input and output primary manifolds 54 and 56 are configured to connect to multiple input and output feeder lines 64 and 66 for the different GIC shells 20 of a multi-shell GIC mirror, as described below.

Cooling lines 30, input and output secondary manifolds 44 and 46, input and output feeder lines 64 and 66, and input and output primary manifolds 54 and 56 form a sealed cooling fluid flow path through which a cooling fluid 100 flows in the direction from input primary manifold 54 to output primary manifold 56. A preferred cooling fluid 100 is water, and more preferably is deionized water.

In an example embodiment, securing members 80 are provided on the input and output feeder lines 64 and 66, on input and output secondary manifolds 44 and 46, or at the interface thereof, for securing GIC shell 20 to a cooled spider 250 (introduced and discussed below) configured to maintain multiple GIC shells 20 in a separated configuration.

GIC shell cooling system 10 optionally includes one or more support struts 90 arranged generally perpendicular to cooling lines 30 and that are fixed to the cooling lines on the side opposite GIC shell back surface 22. Support struts 90 are configured to maintain cooling lines 30 in a select configuration as GIC shell cooling system 10 is moved about and ultimately arranged on the GIC shell back surface 22 and thermally contacted thereto, as described below.

Figure 2:
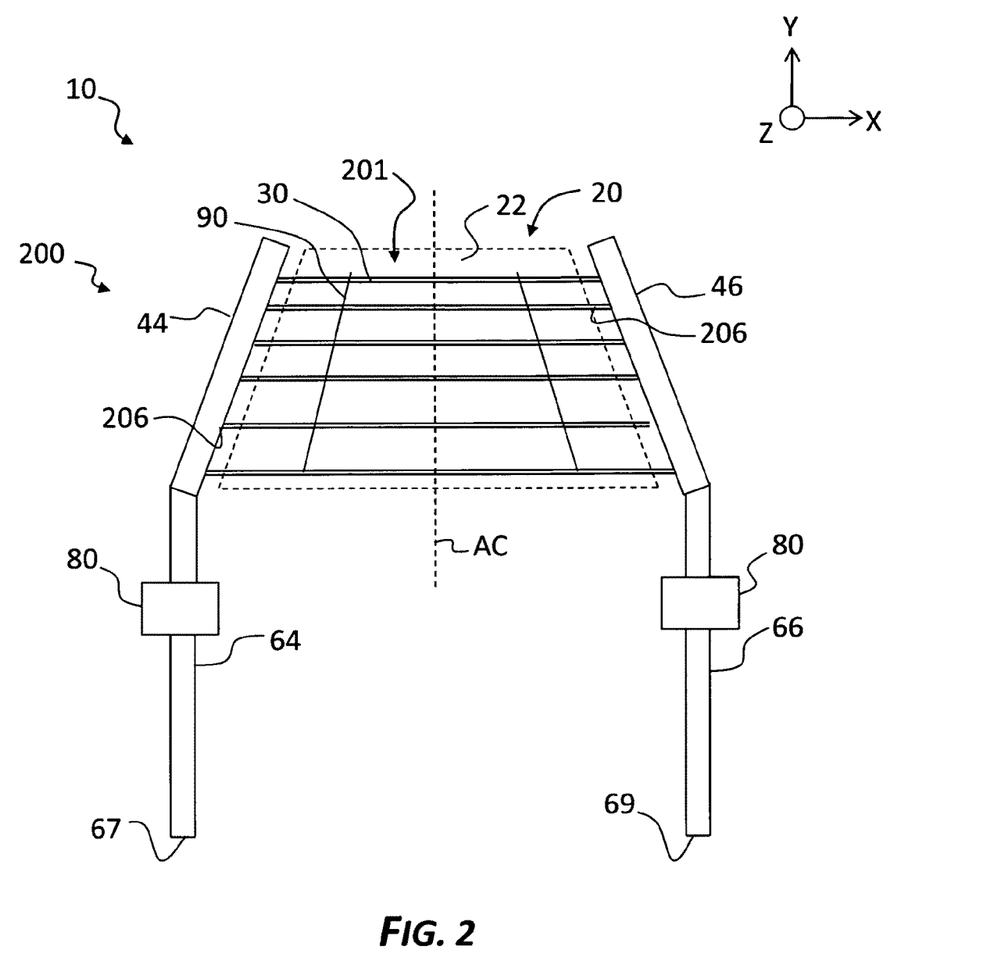
FIG. 2 is schematic diagram of the mirror cooling assembly (MCA) of the GIC shell cooling system.

With reference to FIG. 2, the portion of GIC shell cooling system 10 consisting of cooling lines 30, support struts 90, input and output secondary manifolds 44 and 46, input and output feeder lines 64 and 66 constitutes a "mirror cooling assembly" or MCA 200 that is formed prior to being interfaced with GIC shell 20. The cooling lines 30, along with support struts 90, constitute a cooling line assembly (CLA) 201. GIC shell 20 is shown in phantom in FIG. 2 for the sake of illustration. Once MCA 200 is so formed, it is interfaced to GIC shell 20 (including optionally electroformed) with CLA 201 in contact therewith, and then the MCA is connected at input and output feeder line ends 67 and 69 to input and output primary manifolds 54 and 56.

MCA 200 includes a number of connections 206 that need to be vacuum tight. In an example embodiment, connections 206 are formed by brazing. In order to form the brazed connections and also to electroform MCA 200 and GIC shell 20, the MCA needs to be very clean. In an example embodiment, MCA 200 is initially assembled and then put through a cleaning process. In an example embodiment, the cleaning process includes a "green firing" to burn off contaminants such as organics, oils, liquids, dirt, etc. An example green firing process includes subjecting MCA 200 to a temperature of 800° C. in vacuum for 4 hours. Here, MCA 200 needs to be handled with gloves and other clean environment considerations. The cleaning process may also include, for example, vapor degreasing, ultrasonic cleaning, etc., prior to the green firing step.

At this point, connections 206 are not yet formed. Thus, in an example embodiment, connections 206 are formed to be vacuum tight by forming alloy joints using a hydrogen retort and brazing process. An example of this process includes placing MCA 200 in a vacuum chamber and pumping the chamber down to a suitable vacuum. Hydrogen is added to the chamber, and the chamber interior is brought up to temperature. Because the environment is oxygen-free, no oxygen gets into the joints, which reduces the chances of joint oxidation. The braze material making up the alloyed joints melt and gets wicked into the joints.

The processed MCA 200 is then removed from the vacuum chamber using clean-handling procedures and the MCA is checked for leaks. The clean-handling procedures are continued while MCA is transported to and interfaced with GIC shell 20, which in one embodiment is left on the mandrel on which is was formed to provide structural support during the second electroforming process.

Interfacing MCA 200 with GIC shell 20 includes in one embodiment providing (which includes leaving) the shell on a mandrel, and then the CLA 201 is disposed thereon so that it contacts shell back surface 22. A separation layer is typically used to facilitate the shell removal process. The entire structure—that is, GIC shell 20 and MCA 200 is then electroformed described above. In an example embodiment, GIC shell 20 and MCA 200 are rotated within the electroforming tank (not shown) to enhance the uniformity of the electroforming process.

Once the electroforming process is completed, the electroformed GIC shell 20 along with the attached MCA 200 is then removed from the mandrel. GIC shell 20 is then coated on its inner surface with a reflective coating (not shown) to improve the mirror reflectivity at the given wavelength and over the range of expected radiation angles. The input and output feeder lines 64 and 66 are then respectively connected to input and output primary manifolds 54 and 56. As discussed above, this connection process can be highly problematic because the connection generates stress that can be transmitted through MCA 200 and to GIC shell 20, thereby destroying the proper alignment of the GIC shells or even deforming them. Further, vibrations can be communicated through MCA 200 and to GIC shell 20. For the purposes of this disclosure, vibrations are considered as a form of periodically communicated stress. Accordingly, an aspect of the invention includes the use of stress-decoupling devices when forming such connections, as discussed in greater detail below.

Cooled Spider

Figure 3:
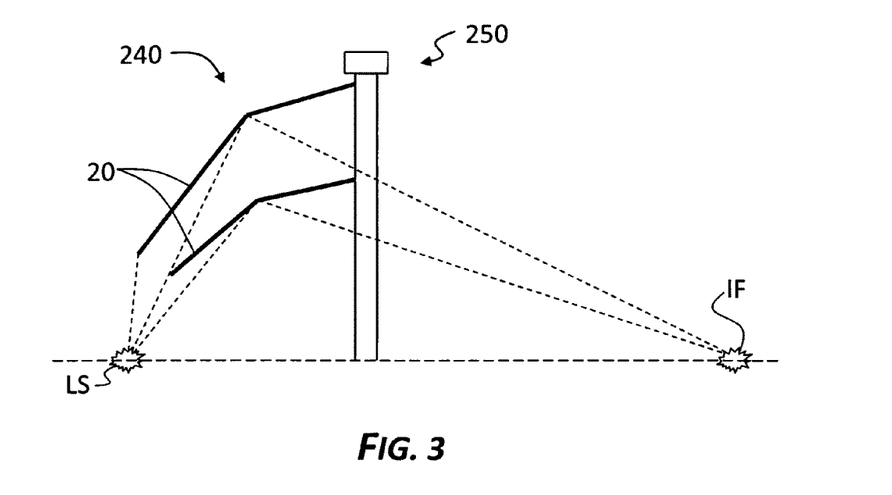
FIG. 3 is a schematic cross-sectional view of an example GIC mirror having multiple GIC shells held in a spaced-apart configuration at the shell leading edges with a spider.

For forming a GIC mirror 240 having multiple GIC shells 20 such as shown in FIG. 3, spider 250 is employed to hold GIC shells 20 in a spaced apart configuration. In an example embodiment, GIC shells 20 are supported at their leading edge and are laser welded or epoxied to spider 250.

Figure 4:
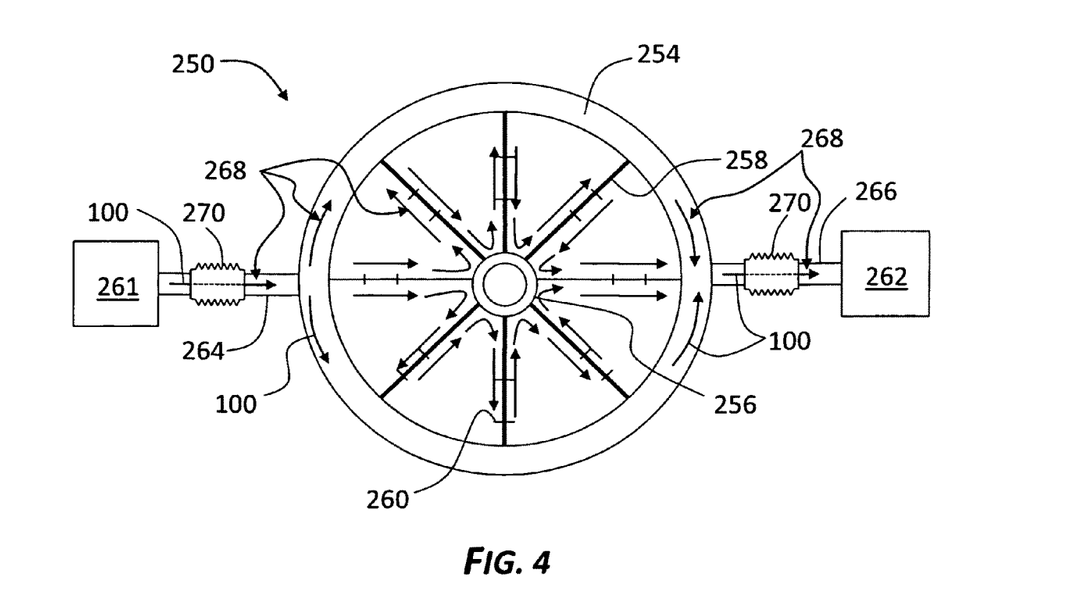
FIG. 4 is a face-on schematic view of an example cooled spider showing an example cooling fluid flow path through the spider from an input cooling-fluid manifold to an output cooling-fluid manifold, and showing stress-decoupling devices disposed in the input and output feeder lines.

FIG. 4 shows a face-on view of an example cooled spider 250 that has inner and outer circular support rings 254 and 256 and a number of radial spokes 258 connecting the two circular support rings 254 and 256. Radial spokes 258 include support features 260 located and sized to accommodate trailing edge of the inner and outer GIC shells 20. In one example, clips 253 (see FIG. 5A) are used to secure GIC shells 20 to radial spokes 258.

Cooled spider 250 includes input and output cooling-fluid manifolds 261 and 262 (hereinafter "spider manifolds") that are fluidly connected to outer circular support ring 254 via respective input and output feeder lines 264 and 266. Outer circular support ring 254 is fluidly connected to inner circular support ring 256 via cooling channels (not shown) in radial spokes 258. An example cooling fluid flow path 268 through cooled spider 250 from the input spider manifold 261 to the output spider manifold 262 is shown in FIG. 4. Stress-decoupling devices 270, which are discussed in greater detail below, are shown as disposed in input and output feeder lines 264 and 266 and are so placed in order to substantially decouple (i.e., reduce or eliminate) any stress associated with fluidly connecting outer circular support ring 254 to input and output spider manifolds 261 and 262.

GIC Mirror System and Stress Decoupling Devices

Figure 5A:
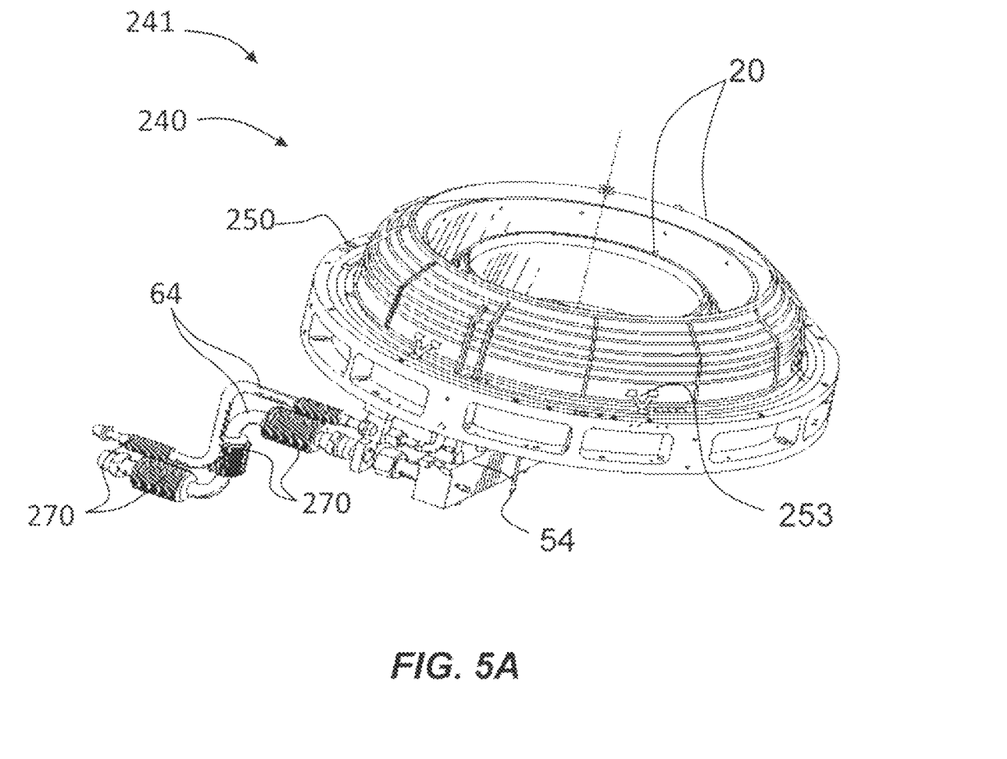
FIG. 5A is a perspective view of an example GIC mirror system that includes a GIC mirror having three GIC shells arranged in a nested configuration and held in place with a cooled spider, wherein stress-decoupling devices in the feeder lines decouple stress that would otherwise be communicated to the GIC shells.
Figure 5B:
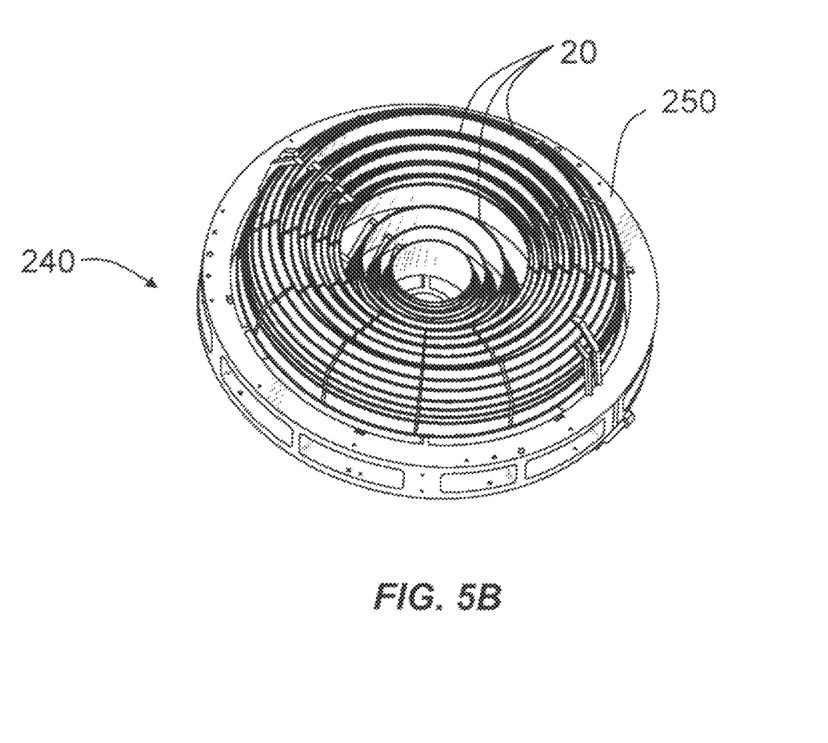
FIG. 5B is a perspective view of the example GIC mirror of FIG. 5A shown as including all nine GIC shells arranged in a nested configuration.

FIG. 5A is a perspective view of an example GIC mirror system 241 that includes a GIC mirror 240 with three GIC shells 20 arranged in a nested configuration and held in place using cooled spider 250. FIG. 5B is a perspective view of an example GIC mirror 240 that includes nine GIC shells 20 arranged in a nested configuration using cooled spider 250.

Once GIC shell 20 is interfaced with MCA 200, the input and output feeder lines 64 and 66 of the MCA need to be operably connected to respective input and output primary manifolds 54 and 56. Likewise, input and output feeder lines 264 and 266 from input and output spider manifolds 261 and 262, respectively, need to be operably connected to spider outer ring 254.

While these connections provide the necessary fluid communication to multiple GIC shell cooling system 10 and cooled spider 250, they can also create mechanical stress in MCA 200 and cooled spider 250 that can end up distorting GIC shell(s) 20. In particular, cooling lines 30 are stiff so that securing the cooling lines 30 to input and output primary manifolds 54 and 56 (e.g., via input and output secondary manifolds 44 and 46) transmits stress to GIC shells 20 and can adversely affect GIC mirror performance.

Likewise, outer circular support ring 254 is stiff so that securing input and output feeder lines 264 and 266 to the outer circular support ring 254 and to input and output spider manifolds 261 and 262 can transmit stress to the outer circular support ring 254, and this stress in turn can be communicated to GIC shells 20. This is of particular concern, since the various fluid connections between the multiple GIC shell cooling systems 10 and their respective manifolds need to be coupled and decoupled several times during the lifetime of a collector. Moreover, since the fluid connections need to be tightened when the GIC collector is already mounted in a complex and densely packed array of machinery rather than in a well controlled assembly environment with unencumbered access, it is more difficult to control the forces during the tightening process.

Figure 6:
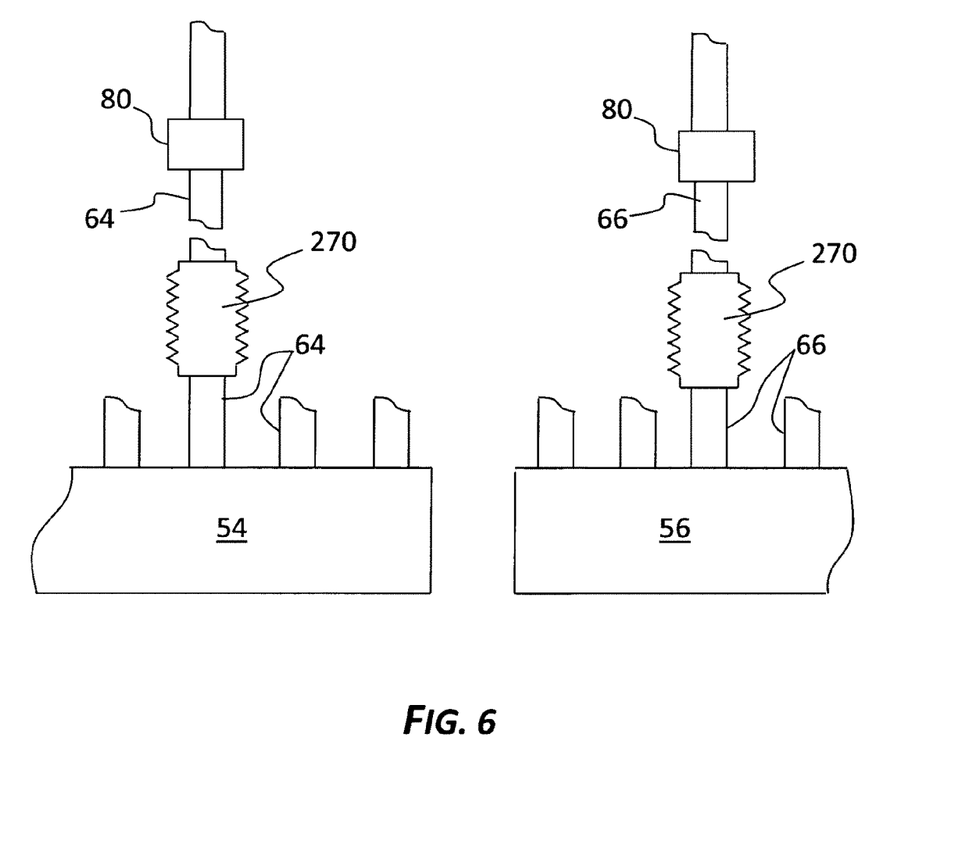
FIG. 6 is a close-up view of a portion of the GIC shell cooling system showing stress-decoupling devices arranged in the input and output feeder lines.

Accordingly, with reference again to FIG. 5A and also FIG. 6, an aspect of the invention includes providing at least one stress-decoupling device 270 within GIC mirror system 241 to reduce an amount of stress that would otherwise be communicated to the GIC shells 20 when connecting the input and output feeder lines 64 and 66 to input and output secondary manifolds 44 and 46 or when connecting input and output feeder lines 264 and 266 to input and output spider manifolds 261 and 262. In one example, stress-decoupling devices 270 are disposed between the input and output primary manifolds 54 and 56 and a GIC shell 20.

In another example, stress-decoupling devices 270 are located between the primary manifolds 54 and 56 and respective secondary manifolds 44 and 46. In one example, stress-decoupling devices 270 are respectively disposed between primary manifolds 54 and 56 and the corresponding feeder lines 64 and 66. In another example embodiment, stress-decoupling devices 270 are disposed in feeder lines 64 and 66 or at one or both of their ends.

In another example embodiment, stress-decoupling devices 270 are respectively disposed in input and output feeder lines 264 and 266 between input and output spider manifolds 261 and 262, such as shown in the example GIC mirror system 241 of FIG. 5A. In a related example embodiment, stress-decoupling devices 270 are disposed at one or both ends of input and output feeder lines 264 and 266.

Generally speaking, stress-decoupling devices 270 can be placed in locations anywhere within GIC mirror system 241 that serve to substantially decouple (i.e., reduce or prevent)

stress from being communicated from one part of the GIC mirror system to one or more GIC shells 20 in GIC mirror 240.

FIG. 6 is a close-up view of the input and output primary manifold end of an example GIC mirror system 241 illustrating an example configuration where stress-decoupling devices 270 are respectively arranged in input and output feeder lines 64 and 66 and thus reside between cooling lines 30 and input and output primary manifolds 54 and 56.

Example Stress-Decoupling Devices

Figure 7:
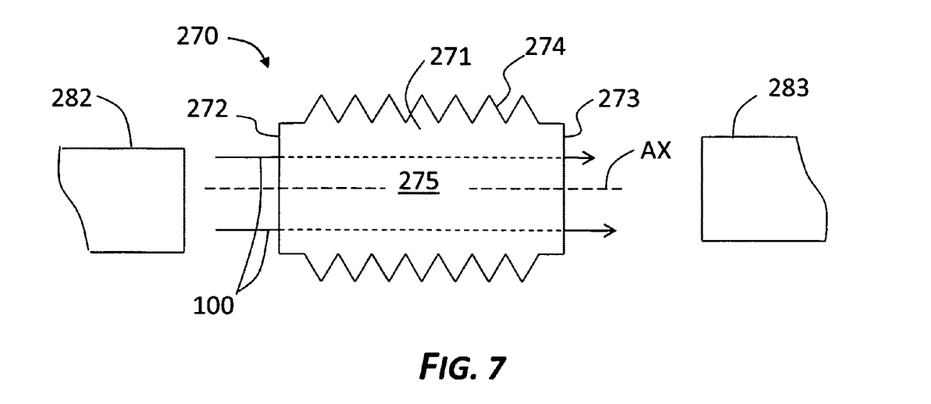
FIG. 7 is an exploded side view of an example stress-decoupling device and two fluid-conducting members.

FIG. 7 is an exploded side view of an example stress-decoupling device 270 and two fluid-conducting members 282 and 283. Stress-decoupling device 270 has an expandable/contractable (E/C) member 271, a central axis AX, ends 272 and 273, and an outer surface 274. E/C member 271 is shown in the form of a bellows by way of example. An example material for a bellows-type of E/C member 271 is stainless steel (e.g., 304 stainless steel).

E/C member 271 is configured to bend as needed, to axially compress and expand, and is generally configured to reduce or prevent an amount of stress from being communicated from end 272 to end 273 when connected to fluid-conducting members 282 and 283 (e.g., cooling lines, feeder lines, cooling-fluid manifolds, etc.). E/C member 271 includes a hollow interior 275 through which cooling fluid 100 can pass from end 272 to end 273 when connected to fluid-conducting members 282 and 283. Ends 272 and 273 are configured to receive a feeder line, cooling line or other type of fluid-conducting member in GIC mirror system 241.

Figure 8:
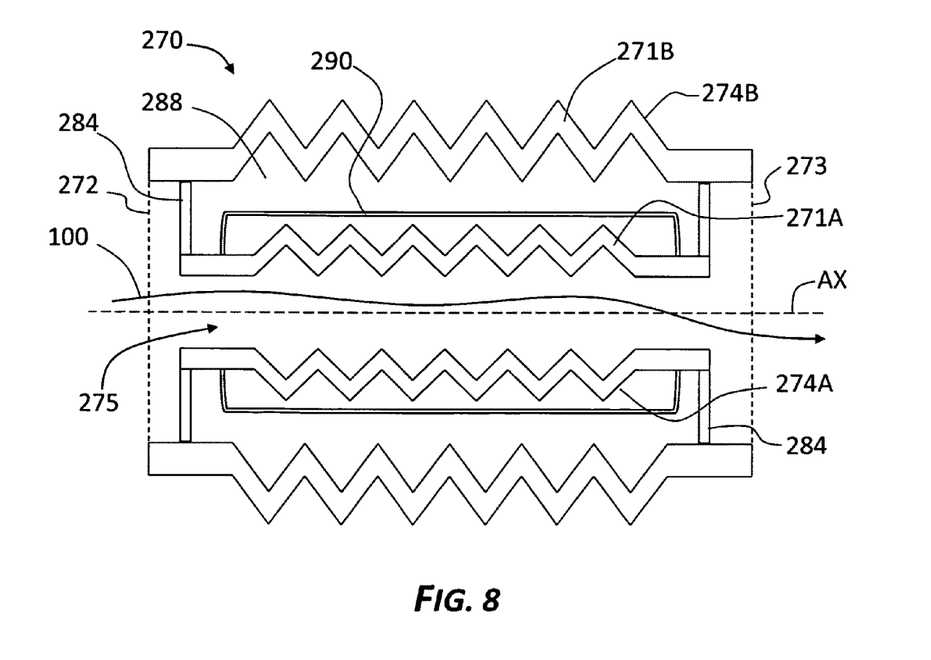
FIG. 8 is a cross-sectional view of an example stress-decoupling device having inner and outer expandable/contractable members, with an expansion-limiting device on the inner expandable/contractable member.

FIG. 8 is a cross-sectional view of an example stress-decoupling device 270 that includes an inner E/C member 271A with outer surface 274A surrounded by but spaced apart from an outer E/C member 271B having an outer surface 274B. The inner and outer E/C members 271A and 271B define an internal chamber 288, which is sealed at respective ends 272 and 273 with respective sealing members 284. Inner E/C member 271A defines the aforementioned hollow interior 275 open at ends 272 and 273 so that cooling fluid 100 can flow through the hollow interior 275 through one end and out the other.

The flow of cooling fluid 100 through stress-decoupling device 270 creates fluid pressure that serves to axially expand E/C member 271. To limit the extent of this axial expansion, in one example stress-decoupling device 270 includes an expansion-limiting member 290 arranged and configured so that the amount of axial expansion of inner E/C member 271A is limited. In an example embodiment illustrated in FIG. 9, expansion-limiting member 290 includes a mesh that surrounds outer surface 274A of inner E/C member 271A.

Figure 9:
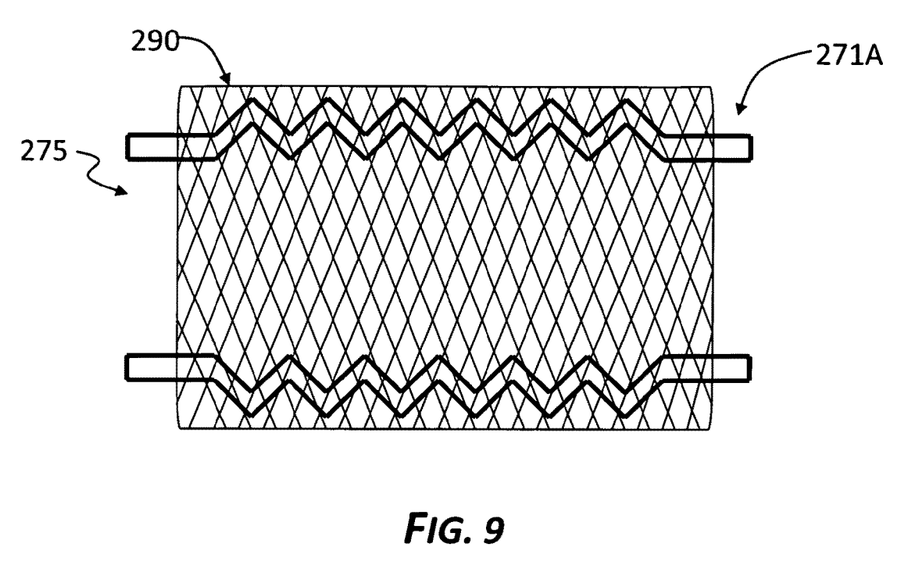
FIG. 9 is a side view of an example expansion-limiting member in the form of a mesh.

In an example embodiment, the mesh-type expansion-limiting member 290 is made of stainless steel. A mesh-type expansion-limiting member 290 loosely fits around inner E/C member 271A while the E/C member is in a neutral or compressed state but limits expansion beyond a certain amount when the E/C member expands when subjected to the expansive force of the cooling-fluid pressure flowing through interior 275.

In an example embodiment, internal chamber 288 is filled with a gas such as helium, nitrogen, etc., particularly in the case where expansion-limiting member 290 needs to be hermetically sealed within the internal chamber 288 because of its material properties. For example, an expansion-limiting member 290 in the form of a mesh represents a potential source of contamination because it can collect contaminants that can later be released into what is typically a clean environment for manufacturing semiconductor devices. Sealing such a mesh within internal chamber 288 prevents the mesh from collecting contaminants and then releasing them into the surrounding environment. In an example, the gas is an inert gas.

It is noted here again that stress-decoupling device also serves to dampen or isolate vibrations (i.e., periodic stress) from being communicated to the GIC shell through the feeder lines.

EUV Lithography System

Figure 10:
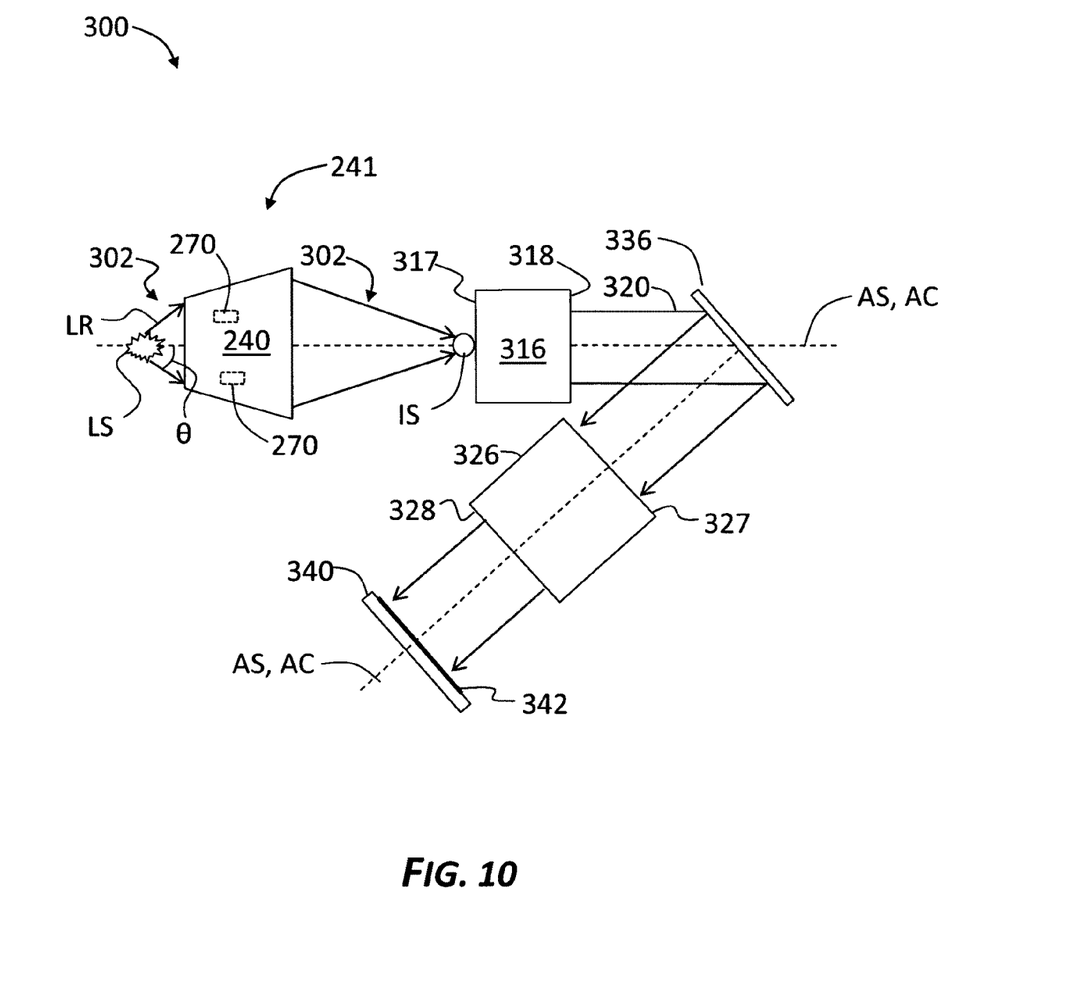
FIG. 10 is a schematic diagram of an example EUV lithography system.

FIG. 10 is an example EUV lithography system ("lithography system") 300 according to the present invention. Example lithography systems 300 are disclosed, for example, in U.S. Patent Applications No. US2004/0265712A1, US2005/0016679A1 and US2005/0155624A1, which Applications are incorporated herein by reference.

Lithography system 300 includes a system axis AS and EUV light source LS, such as a hot plasma source, that emits working EUV radiation 302 at $\lambda=13.5$ nm. EUV radiation 302 is generated, for example, by an electrical discharge source (e.g., a discharged produced plasma, or DPP source), or by a laser beam (laser-produced plasma, or LPP source) on a target of Lithium, Xenon or Tin. EUV radiation 302 emitted from such a LPP source may be roughly isotropic and, in current DPP sources, is limited by the discharge electrodes to a source emission angle of about $\theta=60°$ or more from system axis AS. It is noted that the isotropy of the LPP source will depend on the mass of the target pellet. For relatively high mass targets, the emission is anisotropic, with most of the emerging radiation headed back toward the laser beam due to absorption in the forward direction by the target mass. For a low mass LPP target, which is almost entirely ionized by the laser, the emission is much closer to isotropic.

Lithography system 300 includes a GIC mirror system 241 having cooled GIC mirror 240. GIC mirror system 241 has at least one stress-decoupling device 270 arranged therein to reduce the communication of stress between parts of the GIC mirror system 241, as described above. GIC mirror system 241 is arranged adjacent and downstream of EUV light source LS, with central axis AC of GIC shell 20 lying along system axis AS. GIC mirror 240 collects working EUV radiation 302 (i.e., light rays LR) from EUV light source LS located at source focus and the collected radiation forms intermediate source image IS at intermediate focus IF (See FIG. 3). The multiple GIC shell cooling system 10 and spider cooling system (See FIG. 1 and FIG. 4) provide thermal management of GIC mirror system 241 so that heating from EUV light source LS does not substantially adversely affect the performance of the GIC mirror system 241.

An illumination system 316 with an input end 317 and an output end 318 is arranged along system axis AS and adjacent and downstream of GIC mirror system 241, with the input end 317 adjacent the GIC mirror 240. Illumination system 316 receives at input end 317 EUV radiation 302 from intermediate source image IS and outputs at output end 318 a substantially uniform EUV radiation beam 320 (i.e., condensed EUV radiation). Where lithography system 300 is a scanning type system, EUV radiation beam 320 is typically formed as a substantially uniform line of EUV radiation 302 at reflective reticle 336 that scans over the reflective reticle 336.

A projection optical system 326 is arranged along (folded) system axis AS downstream of illumination system 316. Projection optical system 326 has an input end 327 facing illumination system output end 318, and an opposite output end 328. A reflective reticle 336 is arranged adjacent the projection optical system input end 327 and a semiconductor wafer 340 is arranged adjacent projection optical system output end 328. Reticle 336 includes a pattern (not shown) to be transferred to wafer 340, which includes a photosensitive coating (e.g., photoresist layer) 342.

In operation, the uniformized EUV radiation beam 320 irradiates reflective reticle 336 and reflects therefrom, and the pattern thereon is imaged onto surface of photosensitive coating 342 of semiconductor wafer 340 by projection optical system 326. In a lithography system 300, the reticle image scans over the surface of photosensitive coating 342 to form the pattern over the exposure field. Scanning is typically achieved by moving reflective reticle 336 and semiconductor wafer 340 in synchrony.

Once the reticle pattern is imaged and recorded on wafer 340, the patterned wafer 340 is then processed using standard photolithographic and semiconductor processing techniques to form integrated circuit (IC) chips.

Note that in general the components of system 300 are shown lying along a common folded axis AS in FIG. 10 for the sake of illustration. One skilled in the art will understand that there is often an offset between entrance and exit axes for the various components such as for illumination system 316 and for projection optical system 326.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A method of decoupling stress in a grazing-incidence collector (GIC) mirror system, comprising:
   providing a cooled GIC shell;
   providing input and output primary cooling-fluid manifolds; and
   fluidly connecting the cooled GIC shell to the input and output primary cooling-fluid manifolds through respective stress-decoupling devices, wherein each stress-decoupling device includes a first expandable/contractable member with a flexible expansion-limiting member that loosely fits around the first expandable/contractable member to limit an amount of expansion of the first expandable/contractable member, and a second expandable/contractable member surrounding the first expandable/contractable member and the expansion-limiting member so as to define a sealed cavity, and wherein the sealed cavity is filled with a gas.

2. The method of claim 1, wherein the cooled GIC shell includes at least one cooling line, and further comprising:
   fluidly connecting the input and output primary cooling-fluid manifolds and the at least one cooling line using input and output feeder tubes.

3. The method of claim 2, wherein the stress-decoupling devices are disposed within or at respective ends of the input and output feeder tubes.

4. The method of claim 1, wherein the gas is an inert gas.

5. The method of claim 1, wherein the expansion-limiting member includes a mesh.

6. The method of claim 1, wherein the first and second expandable/contractable members each comprise a bellows.

7. A method of decoupling stress in a grazing-incidence collector (GIC) mirror system having at a cooled GIC shell, comprising:
   configuring a first cooling line on a back surface of the cooled GIC shell;
   fluidly connecting a first feeder line to the first cooling line;
   operably disposing a stress-decoupling device to the first feeder line, wherein the stress-decoupling device includes a first expandable/contractable member with a flexible expansion-limiting member that loosely fits around the first expandable/contractable member to limit an amount of expansion of the first expandable/contractable member, and a second expandable/contractable member surrounding the first expandable/contractable member and the expansion-limiting member so as to define a sealed cavity, and wherein the sealed cavity is filled with a gas; and
   fluidly connecting the first feeder line to a first primary cooling-fluid manifold.

8. The method of claim 7, further comprising:
   fluidly connecting a second feeder line to the first cooling line;
   operably disposing another stress-decoupling device to the second feeder line; and
   fluidly connecting the second feeder line to a second primary cooling-fluid manifold.

9. The method of claim 8, further comprising:
   fluidly connecting the first cooling line and the first and second feeder lines to respective first and second secondary manifolds.

10. The method of claim 8, further comprising:
    configuring multiple cooling lines on a back surface of the cooled GIC shell; and
    fluidly connecting the multiple cooling lines to the first and second secondary manifolds.

11. A stress-decoupling device for a cooled mirror system that uses a cooling fluid, comprising:
    a first expandable/contractable member having a cavity through which the cooling fluid can flow and having respective ends configured to receive respective fluid-conducting members;
    a flexible expansion-limiting member loosely arranged around the first expandable/contractable member to limit an amount of expansion of the first expandable/contractable member; and
    a second expandable/contractable member surrounding the first expandable/contractable member and the expansion-limiting member so as to define a sealed cavity, and wherein the sealed cavity is filled with a gas.

12. The method of claim 11, wherein the expansion-limiting member includes a mesh.

13. The method of claim 11, wherein the first and second expandable/contractable members each comprise a bellows.

14. A grazing-incidence collector (GIC) mirror system, comprising:
    a GIC mirror having at least one GIC shell that is cooled with cooling lines adapted to carry a cooling fluid and supported by a spider; and
    primary input and output cooling manifolds that contain the cooling fluid and that are fluidly connected to the cooling lines through respective stress-decoupling devices each having a first expandable/contractable member having a cavity through which the cooling fluid can flow, and a flexible expansion-limiting member loosely arranged around the first expandable/contractable member to limit an amount of expansion of the first expandable/contractable member, and a second expandable/contractable member surrounding the first expandable/contractable member and the expansion-limiting member so as to define a sealed cavity, and wherein the sealed cavity is filled with a gas.

15. The GIC mirror system of claim 14, wherein the spider is cooled, and further comprising:

spider input and output cooling manifolds fluidly connected to the spider via input and output feeder lines that respectively include additional stress-decoupling devices.

16. An extreme ultraviolet (EUV) lithography system for illuminating a reflective mask, comprising:
   a source of EUV radiation;
   a GIC mirror system of claim 14, configured to receive the EUV radiation and form collected EUV radiation; and
   an illuminator configured to receive the collected EUV radiation and form condensed EUV radiation for illuminating the reflective reticle.

17. The EUV lithography system of claim 16 for forming a patterned image on a photosensitive semiconductor wafer, further comprising:
   a projection optical system arranged downstream of the reflective reticle and configured to receive reflected EUV radiation from the reflective reticle and form therefrom the patterned image on the photosensitive semiconductor wafer.

18. A cooling system for an extreme ultraviolet (EUV) grazing incidence collector (GIC) having at least one shell with a back surface and a central axis, comprising:
   a plurality of spaced apart substantially circular cooling lines arranged in substantially parallel planes that are substantially perpendicular to the shell central axis, the cooling lines thermally contacting and running around a corresponding circumference of the back surface;
   input and output cooling-fluid manifolds that contain a cooling fluid and that are respectively fluidly connected to the plurality of cooling lines at spaced apart input and output locations;
   at least one first stress-decoupling device operatively and arranged between the input cooling-fluid manifold and the input location;
   at least one second stress-decoupling device operatively and arranged between the output cooling-fluid manifold and the output location; and
   wherein the at least one first and at least one second stress-decoupling devices each have a first expandable/contractable member having a cavity through which the cooling fluid can flow, and a flexible expansion-limiting member loosely arranged around the first expandable/contractable member to limit an amount of expansion of the first expandable/contractable member, and a second expandable/contractable member surrounding the first expandable/contractable member and the expansion-limiting member so as to define a sealed cavity, and wherein the sealed cavity is filled with a gas.

19. The cooling system of claim 18, wherein the flexible expansion-limiting member comprises a mesh.

20. The cooling system of claim 19, wherein the mesh comprises stainless steel.

21. The cooling system of claim 18, wherein the sealed interior chamber is filled with a gas.

22. The system of claim 18, further comprising:
   a plurality of spaced-apart nested GIC shells each having respective pluralities of cooling lines connected to the input and output cooling-fluid manifolds via respective stress-decoupling devices; and
   a spider configured to maintain the spaced-apart configuration of the nested shells, the spider being cooled and having a cooling fluid flowing thereto and therefrom through additional stress-decoupling devices.

23. A method of forming a cooled grazing incident collector (GIC) shell having a backside and a central axis, comprising:
   providing a cooling assembly having cooling lines thermally contacting the GIC shell and that carry a cooling fluid;
   providing a plurality of stress-decoupling devices each having a first expandable/contractable member having a cavity through which the cooling fluid can flow, and a flexible expansion-limiting member loosely arranged around the first expandable/contractable member to limit an amount of expansion of the first expandable/contractable member due to pressure from a flow of cooling fluid through the expandable/contractable member and a second expandable/contractable member surrounding the first expandable/contractable member and the expansion-limiting member so as to define a sealed cavity, and wherein the sealed cavity is filled with a gas; and
   fluidly connecting each cooling line to the input and output cooling-fluid manifolds through respective ones of the stress-decoupling devices to reduce an amount of stress communicated between the cooling assembly and the input and output cooling-fluid manifolds when the cooling lines and input and output cooling-fluid manifolds are fluidly connected.

* * * * *